United States Patent
Zuolo et al.

(10) Patent No.: US 11,699,493 B2
(45) Date of Patent: Jul. 11, 2023

(54) METHOD AND APPARATUS FOR PERFORMING A READ OF A FLASH MEMORY USING PREDICTED RETENTION-AND-READ-DISTURB-COMPENSATED THRESHOLD VOLTAGE SHIFT OFFSET VALUES

(71) Applicant: Microchip Technology Inc., Chandler, AZ (US)

(72) Inventors: Lorenzo Zuolo, Lusia (IT); Rino Micheloni, Turate (IT)

(73) Assignee: Microchip Technology Inc., Chandler, AZ (US)

(*) Notice: Subject to any disclaimer, the term of this patent is extended or adjusted under 35 U.S.C. 154(b) by 0 days.

(21) Appl. No.: 17/385,857

(22) Filed: Jul. 26, 2021

(65) Prior Publication Data
US 2022/0375532 A1 Nov. 24, 2022

Related U.S. Application Data

(60) Provisional application No. 63/192,543, filed on May 24, 2021.

(51) Int. Cl.
*G11C 16/34* (2006.01)
*G06N 3/08* (2023.01)
(Continued)

(52) U.S. Cl.
CPC ......... *G11C 16/3427* (2013.01); *G06N 3/063* (2013.01); *G06N 3/08* (2013.01);
(Continued)

(58) Field of Classification Search
CPC ... G11C 16/3427; G11C 16/102; G11C 16/26; G11C 16/3404; G11C 16/3495; G06N 3/063; G06N 3/08
See application file for complete search history.

(56) References Cited

U.S. PATENT DOCUMENTS 6,567,313 B2   5/2003   Tanaka et al.
6,704,871 B1   3/2004   Kaplan et al.
(Continued)

FOREIGN PATENT DOCUMENTS

WO   2020117348 A3   12/2020

OTHER PUBLICATIONS

Anonymous, "Training checkpoints | TensorFlow Core", Dec. 28, 2019, XP055886114, p. 1-p. 8, Retrieved from the Internet.
(Continued)

*Primary Examiner* — Vanthu T Nguyen
(74) *Attorney, Agent, or Firm* — Glass and Associates; Kenneth Glass

(57) ABSTRACT

A method for performing a read of a flash memory includes storing configuration files for a plurality of RRD-compensating RNNs. A current number of PE cycles for a flash memory are identified and TVSO values are identified corresponding to the current number of PE cycles. A current retention time and a current number of read disturbs for the flash memory are identified. The configuration file of the RRD-compensating RNN corresponding to the current number of PE cycles, the current retention time and current number of read disturbs is selected and is loaded into a neural network engine to form an RNN core in the neural network engine. A neural network operation of the RNN core is performed to predict RRD-compensated TVSO values. The input to the neural network operation includes the identified TVSO values. A read of the flash memory is performed using the predicted RRD-compensated TVSO values.

18 Claims, 15 Drawing Sheets

(51) Int. Cl.
  *G11C 16/26* (2006.01)
  *G06N 3/063* (2023.01)
  *G11C 16/10* (2006.01)
(52) U.S. Cl.
  CPC .......... *G11C 16/102* (2013.01); *G11C 16/26* (2013.01); *G11C 16/3404* (2013.01); *G11C 16/3495* (2013.01)

(56) References Cited

U.S. PATENT DOCUMENTS

| | | | |
|---|---|---|---|
| 7,529,215 B2 | 5/2009 | Osterling et al. |
| 7,650,480 B2 | 1/2010 | Jiang |
| 7,930,623 B2 | 4/2011 | Pisek et al. |
| 8,429,325 B1 | 4/2013 | Onufryk et al. |
| 8,621,318 B1 | 12/2013 | Micheloni et al. |
| 8,656,257 B1 | 2/2014 | Micheloni et al. |
| 8,665,648 B2 | 3/2014 | Mun et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,966,335 B2 | 2/2015 | Lunelli et al. |
| 8,971,112 B2 | 3/2015 | Crippa et al. |
| 8,990,661 B1 | 3/2015 | Micheloni et al. |
| 9,092,353 B1 | 7/2015 | Micheloni et al. |
| 9,128,858 B1 | 9/2015 | Micheloni et al. |
| 9,235,467 B2 | 1/2016 | Micheloni et al. |
| 9,251,909 B1 | 2/2016 | Camp et al. |
| 9,268,531 B1 | 2/2016 | Woo et al. |
| 9,292,428 B2 | 3/2016 | Kanamori et al. |
| 9,305,661 B2 | 4/2016 | Micheloni et al. |
| 9,397,701 B1 | 7/2016 | Micheloni et al. |
| 9,417,804 B2 | 8/2016 | Micheloni et al. |
| 9,444,655 B2 | 9/2016 | Sverdlov et al. |
| 9,448,881 B1 | 9/2016 | Micheloni et al. |
| 9,450,610 B1 | 9/2016 | Micheloni et al. |
| 9,454,414 B2 | 9/2016 | Micheloni et al. |
| 9,590,656 B2 | 3/2017 | Micheloni et al. |
| 9,747,200 B1 | 8/2017 | Micheloni |
| 9,799,405 B1 | 10/2017 | Micheloni et al. |
| 9,813,080 B1 | 11/2017 | Micheloni et al. |
| 9,886,214 B2 | 2/2018 | Micheloni et al. |
| 9,892,794 B2 | 2/2018 | Micheloni et al. |
| 9,899,092 B2 | 2/2018 | Micheloni |
| 10,152,273 B2 | 12/2018 | Micheloni et al. |
| 10,157,677 B2 | 12/2018 | Marelli et al. |
| 10,216,422 B2* | 2/2019 | Kim .................. G06F 3/0614 |
| 10,230,396 B1 | 3/2019 | Micheloni et al. |
| 10,283,215 B2 | 5/2019 | Marelli et al. |
| 10,291,263 B2 | 5/2019 | Marelli et al. |
| 10,332,613 B1 | 6/2019 | Micheloni et al. |
| 10,490,288 B1 | 11/2019 | Wang et al. |
| 10,715,307 B1 | 7/2020 | Jin |
| 10,861,562 B1 | 12/2020 | Xiong et al. |
| 11,398,291 B2 | 7/2022 | Zuolo et al. |
| 2002/0144210 A1 | 10/2002 | Borkenhagen et al. |
| 2006/0106743 A1 | 5/2006 | Horvitz |
| 2006/0282603 A1 | 12/2006 | Onufryk et al. |
| 2007/0076873 A1 | 4/2007 | Yamamoto et al. |
| 2011/0255453 A1 | 10/2011 | Roh et al. |
| 2012/0166714 A1 | 6/2012 | Mun et al. |
| 2012/0287719 A1 | 11/2012 | Mun et al. |
| 2014/0040697 A1 | 2/2014 | Loewenstein |
| 2014/0281800 A1 | 9/2014 | Micheloni et al. |
| 2014/0281823 A1 | 9/2014 | Micheloni et al. |
| 2014/0310534 A1 | 10/2014 | Gurgi et al. |
| 2015/0033037 A1 | 1/2015 | Lidman |
| 2015/0049548 A1* | 2/2015 | Park .................. G11C 16/3427 365/185.11 |
| 2016/0072527 A1 | 3/2016 | Suzuki et al. |
| 2016/0247581 A1 | 8/2016 | Suzuki et al. |
| 2016/0266791 A1 | 9/2016 | Lin et al. |
| 2017/0133107 A1 | 5/2017 | Ryan et al. |
| 2017/0213597 A1 | 7/2017 | Micheloni |
| 2018/0033490 A1 | 2/2018 | Marelli et al. |
| 2019/0004734 A1 | 1/2019 | Kirshenbaum et al. |
| 2019/0087119 A1 | 3/2019 | Oh et al. |
| 2019/0095794 A1 | 3/2019 | López et al. |
| 2019/0317901 A1 | 10/2019 | Kachare et al. |
| 2020/0004455 A1 | 1/2020 | Williams et al. |
| 2020/0066361 A1 | 2/2020 | Ioannou et al. |
| 2020/0074269 A1 | 3/2020 | Trygg et al. |
| 2020/0125955 A1 | 4/2020 | Klinger et al. |
| 2020/0151539 A1 | 5/2020 | Oh et al. |
| 2020/0183826 A1 | 6/2020 | Beaudoin et al. |
| 2020/0185027 A1 | 6/2020 | Rom et al. |
| 2020/0210831 A1 | 7/2020 | Zhang et al. |
| 2021/0192333 A1 | 6/2021 | Thiruvengadam et al. |
| 2022/0027083 A1 | 1/2022 | Zuolo et al. |
| 2022/0051730 A1 | 2/2022 | Choi et al. |
| 2022/0058488 A1 | 2/2022 | Zuolo et al. |
| 2022/0165348 A1 | 5/2022 | Zuolo et al. |
| 2022/0188604 A1 | 6/2022 | Zuolo et al. |
| 2022/0270698 A1 | 8/2022 | Zuolo et al. |
| 2022/0342582 A1 | 10/2022 | Graumann |

OTHER PUBLICATIONS

PCT/2021/053276, International Search Report and Written Opinion, European Patent Office, dated Feb. 11, 2022.

U.S. Appl. No. 63/057,278, filed Jul. 27, 2020, Lorenzo Zuolo.

Noam Shazeer et al: Outrageously Large Neural Networks: The Sparsely-Gated Mixture-of-Experts Layer11 , Arxiv .Org, Cornell University Li Bra Ry, 201 Olin Li Bra Ry Cornell University Ithaca, NY 14853, Jan. 23, 2017.

Yu Cai et al, "Errors in Flash-Memory-Based Solid-State Drives: Analysis, Mitigation, and Recovery" 11 , Arxiv.Org, Cornell University Library, 201 Olin Library Cornell University Ithaca, NY 14853, Nov. 28, 2017.

PCT/US2021/053276, International Search Report and Written Opinion, European Patent Office, dated Feb. 11, 2022.

U.S. Appl. No. 17/398,091, filed Aug. 10, 2021, Lorenzo Zuolo.

U.S. Appl. No. 17/506,735, filed Oct. 21, 2021, Lorenzo Zuolo.

* cited by examiner

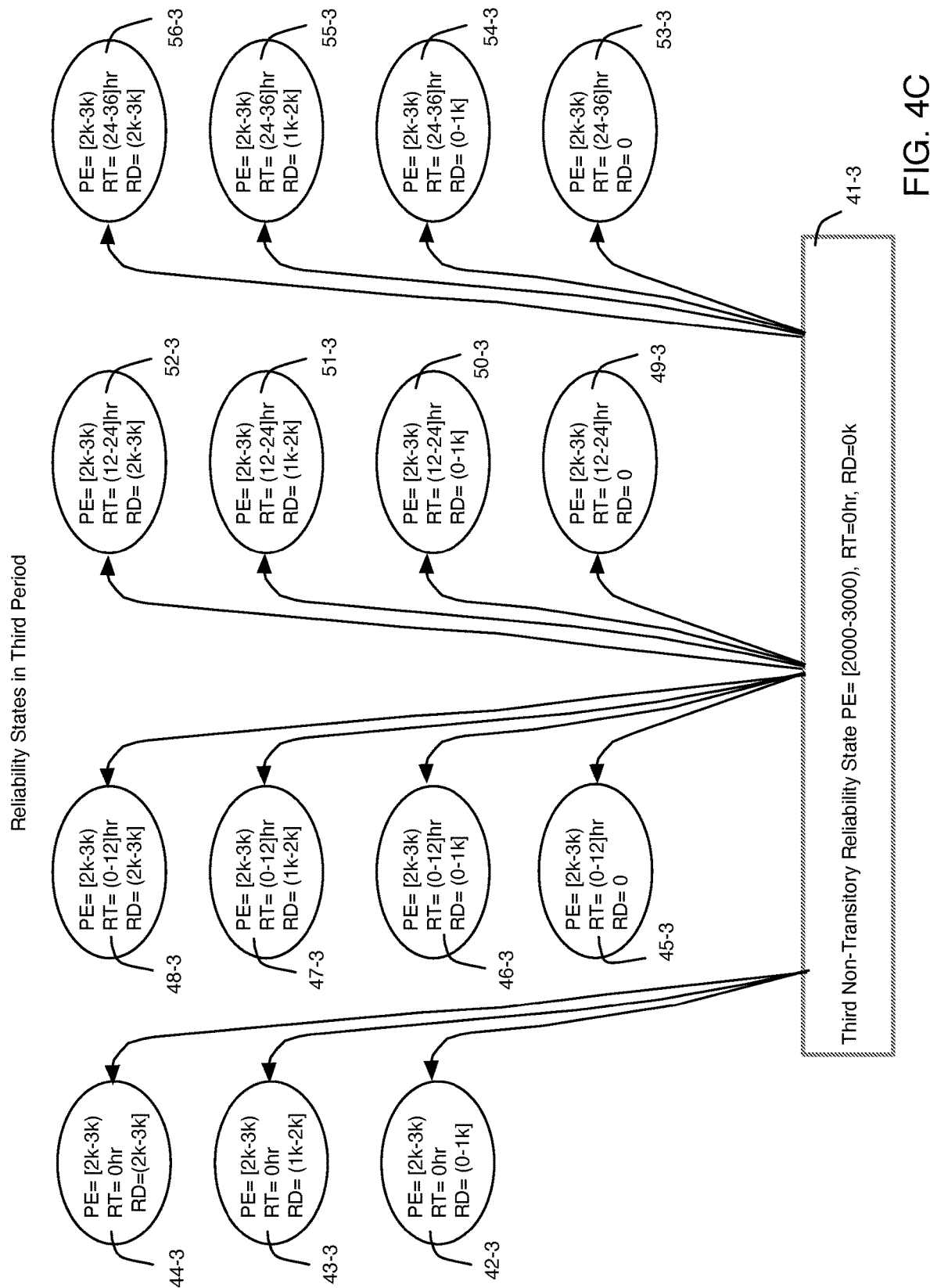

FIG. 5

| | WL | Block | TVSO1 | TVSO2 | TVSO3 | TVSO4 | TVSO5 | TVSO6 | TVSO7 |
|---|---|---|---|---|---|---|---|---|---|
| PE=x, RT=0h, RD=0 | | | | | | | | | | 61
| PE=x, RT=0h, RD=500 | | | | | | | | | | 62
| PE=x, RT=0h, RD=1500 | | | | | | | | | | 63
| PE=x, RT=0h, RD=2500 | | | | | | | | | | 64
| PE=x+1, RT=6h, RD=0 | | | | | | | | | | 65
| PE=x+1, RT=6h, RD=500 | | | | | | | | | | 66
| PE=x+1, RT=6h, RD=1500 | | | | | | | | | | 67
| PE=x+1, RT=6h, RD=2500 | | | | | | | | | | 68
| PE=x+2, RT=18h, RD=0 | | | | | | | | | | 69
| PE=x+2, RT=18h, RD=500 | | | | | | | | | | 70
| PE=x+2, RT=18h, RD=1500 | | | | | | | | | | 71
| PE=x+2, RT=18h, RD=2500 | | | | | | | | | | 72
| PE=x+3, RT=30h, RD=0 | | | | | | | | | | 73
| PE=x+3, RT=30h, RD=500 | | | | | | | | | | 74
| PE=x+3, RT=30h, RD=1500 | | | | | | | | | | 75
| PE=x+3, RT=30h, RD=2500 | | | | | | | | | | 76

METHOD AND APPARATUS FOR PERFORMING A READ OF A FLASH MEMORY USING PREDICTED RETENTION-AND-READ-DISTURB-COMPENSATED THRESHOLD VOLTAGE SHIFT OFFSET VALUES

CROSS-REFERENCE TO RELATED APPLICATIONS

The present application claims priority to U.S. Provisional Patent Application Ser. No. 63/192,543 filed on May 24, 2021, the contents of which are incorporated by reference herein in their entirety.

BACKGROUND OF THE INVENTION

Solid State Drives (SSD's) use standard read instructions (e.g., READ or READ PAGE instruction) perform a read of a memory cell at a default threshold voltage within each threshold voltage region required to define a bit of the memory cell. Single Level Cell (SLC) flash memory devices store a single bit of information in each cell and only require a read in a single threshold voltage region (the threshold voltage region is the region that extends between the center of the voltage distribution for a 1 and the center of the voltage distribution for a 0) to identify the value of a bit (whether the cell is storing a 1 or a 0). Multi-level cell (MLC) flash memory devices store two bits of information in each cell, triple level cell (TLC) flash memory devices store three bits of information in each cell, quad level cell (QLC) flash memory devices store four bits of information in each cell and penta level cell (PLC) flash memory devices store five bits of information in each cell.

Some SSD's use threshold-voltage-shift reads for reading flash memory devices to obtain low levels of Uncorrectable Bit Error Rate (UBER) required for client and enterprise SSD's. Threshold-voltage-shift reads are performed by sending a threshold-voltage-shift read instruction to a flash memory device that is to be read. One or more threshold-Voltage-Shift Offset (TVSO) value is sent with the threshold-voltage-shift read instruction. The TVSO value indicates the amount by which the threshold voltage that is used to perform the read is to be offset from a corresponding default threshold voltage that is specified by the manufacturer of the flash memory device. Threshold-voltage-shift read instructions for MLC, TLC, QLC and PLC flash memory devices require that multiple TVSO values be sent to the flash memory device in order to perform each read.

Systems that use threshold-voltage-shift read instructions for reading flash memory devices typically require background reads of the flash memory devices to identify the correct TVSO value to use in performing reads. The background reads require significant bandwidth, reducing the amount of bandwidth available for performing host-requested operations.

For systems that use threshold-voltage-shift read instructions for reading flash memory devices, there is a need for a method and apparatus that will allow for identifying TVSO values to be used in reads of a flash memory device that does not require background reads for identifying TVSO values, and that will allow for maintaining UBER within acceptable levels during the lifetime of the SSD.

SUMMARY OF THE INVENTION

A method for identifying TVSO values to be used for reading a flash memory includes storing configuration files for a plurality of retention-and-read-disturb (RRD)-compensating regression neural networks (RNNs); identifying a current number of program and erase (PE) cycles of the flash memory; identifying TVSO values corresponding to the identified current number of PE cycles and identifying a current retention time and a current number of read disturbs for the flash memory. The configuration file of the RRD-compensating RNN corresponding to the current number of PE cycles, the current retention time and the current number of read disturbs for the flash memory is selected and is loaded into a neural network engine to form an RNN core in the neural network engine. A neural network operation of the RNN core is performed to predict RRD-compensated TVSO values. The input to the neural network operation includes the identified TVSO values corresponding to the current number of PE cycles of the flash memory. The predicted RRD-compensated TVSO values are optionally stored. A read of the flash memory is performed using the predicted RRD-compensated TVSO values.

A flash controller includes a data storage; a neural network engine coupled to the data storage; and a status module configured for identifying a current number of PE cycles, a current retention time and a current number of read disturbs for a flash memory. A control module is coupled to the neural network engine, the data storage and the status module. The control module to identify TVSO values corresponding to a current number of PE cycles of the flash memory, the control module further to select a configuration file of a RRD-compensating RNN corresponding to the current number of PE cycles, the current retention time and the current read disturb of the flash memory; and to load the selected configuration file of the RRD-compensating RNN into the neural network engine to form a RNN core in the neural network engine. The neural network engine to perform a neural network operation of the RNN core to predict RRD-compensated TVSO values, the input to the neural network operation including the identified TVSO values corresponding to the current number of PE cycles of the flash memory. A read module is coupled to the status module and to the neural network engine. The read module to perform a read of the flash memory using the predicted RRD-compensated TVSO values.

The method and apparatus of the present invention provides a simple and accurate process for identifying TVSO values to be used in reads of a flash memory device and does not require background reads for identifying the TVSO values. Thereby the bandwidth that would have been consumed in performing background reads is available for host-requested read, program and erase operations.

BRIEF DESCRIPTION OF THE DRAWINGS

The accompanying drawings are included to provide a further understanding of the invention, and are incorporated in, and constitute a part of, this specification. The drawings illustrate various examples. The drawings referred to in this brief description are not drawn to scale.

FIG. 4A-4E are diagrams that illustrate reliability states.

FIG. 5 is a block diagram illustrating data records to be used for training an RRD-compensating RNN.

DETAILED DESCRIPTION

Figure 1:
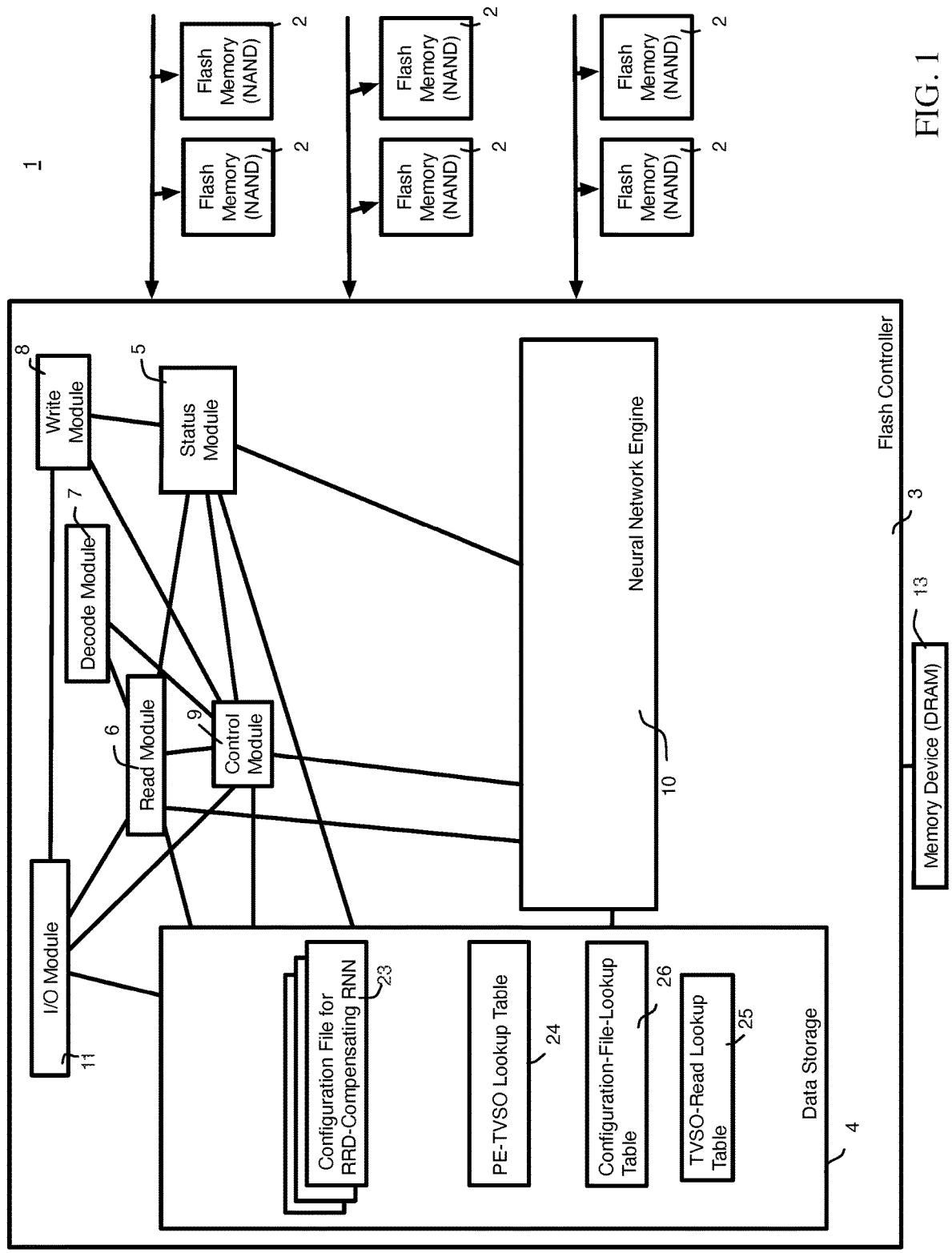
FIG. 1 is a graph illustrating an SSD that includes a flash controller, flash memory devices and a memory device.

FIG. 1 shows an SSD 1 that includes a flash controller 3, a plurality of flash memory devices 2 (each of which are referred to herein singularly as a flash memory 2) and memory device 13. Flash controller 3 is coupled to flash memory devices 2 for storing data and for reading data using threshold voltage shift reads of flash memory devices 2. In one example, flash memory devices 2 are NAND devices and flash controller 3, flash memory devices 2 and memory device 13 are mounted to a circuit board (not shown). Memory device 13 is a volatile memory device such as a Dynamic Random Access Memory (DRAM) that is electrically coupled to flash controller 3.

Flash controller 3 includes data storage 4, status module 5, read module 6, decode module 7, write module 8, control module 9, neural network engine 10 and input and output (I/O) module 11. Control module 9 is coupled to data storage 4, status module 5, read module 6, decode module 7, write module 8, neural network engine 10 and input and output (I/O) module 11. Decode module 7 is further coupled to read module 6. Status module 5 is further coupled to data storage 4, read module 6, write module 8 and neural network engine 10. Read module 6 is further coupled to data storage 4, neural network engine 10 and I/O module 11. Neural network engine 10 is further coupled to data storage 4. Input and output (I/O) module 11 is further coupled to data storage 4 and write module 8.

Some or all of modules 5-11, include circuits that are dedicated circuits for performing operations, and some or all of modules 5-11 can be firmware that includes instructions that are performed on one or more processor for performing operations of flash controller 3, with the instructions stored in registers of one or more of modules 5-11 and/or stored in data storage 4 or memory device 13. Some of all of modules 5-11 include processors for performing instructions and instructions are loaded into flash controller 3 prior to operation of flash controller 3 by a user.

Flash controller 3 is configured to receive read and write instructions from a host computer at I/O module 11 and to perform program operations, erase operations and read operations on memory cells of flash memory devices 2 to complete the instructions from the host computer. For example, upon receiving a write instruction from a host computer, write module 8 is operable to program codewords into one or more of flash memory devices 2.

Reads of flash memory devices 2 are performed by sending a threshold-voltage-shift read instruction to the flash memory device 2 that is to be read. One or more TVSO value are sent with the threshold-voltage-shift read instruction. Flash memory devices 2 can be MLC flash memory devices, TLC flash memory devices, QLC flash memory devices or PLC flash memory devices. Status module 5 is operable to track the status and the operations of flash controller 3 and flash memory devices 2. Data storage module 4 is a structure in flash controller 3 that is capable of storing data, and may include cache memory and/or static random-access memory (SRAM). Neural network engine 11 includes a specialized hardware module (e.g., a specialized configurable accelerator/processing circuit) specifically configured to perform a neural network operation.

Figure 2:
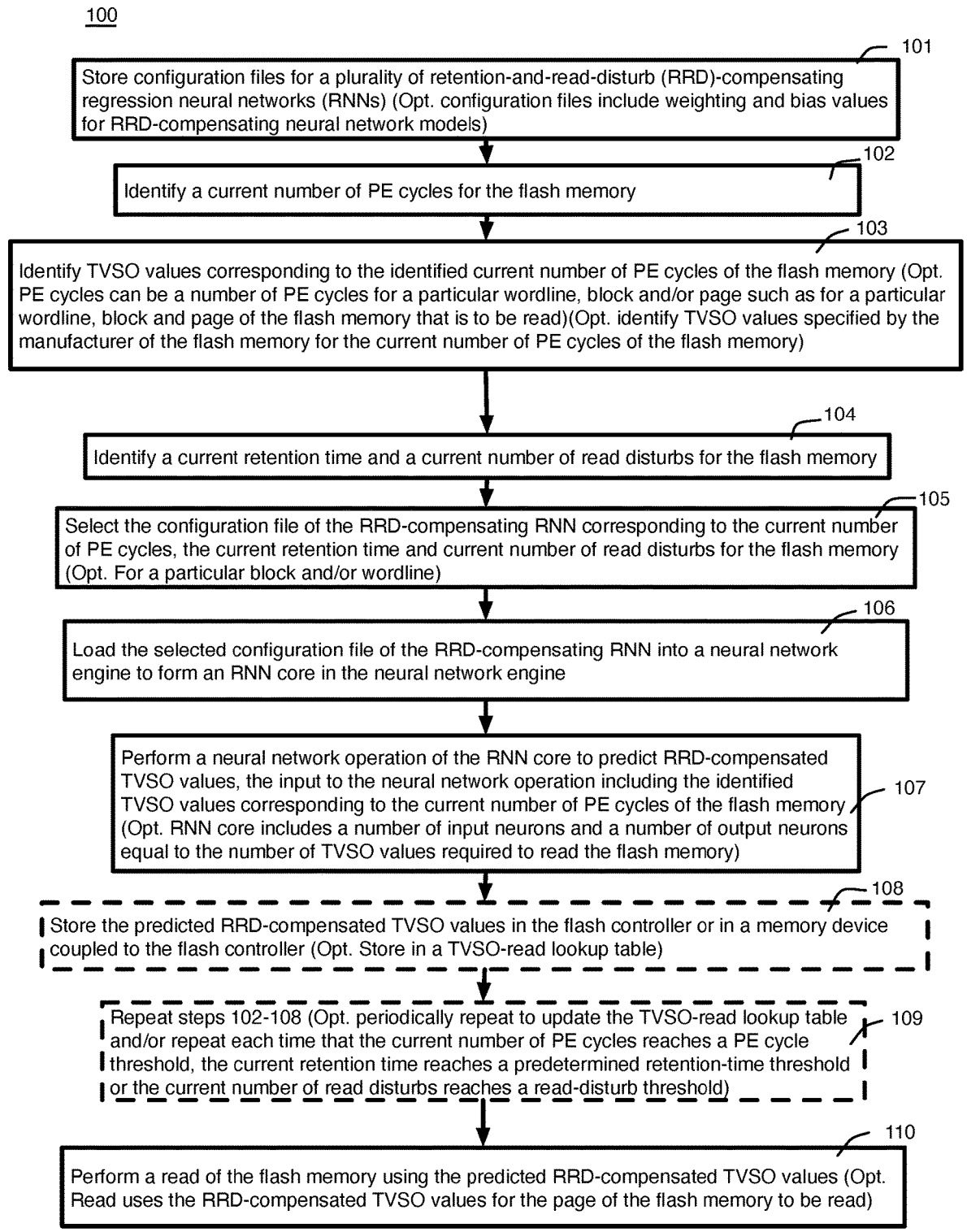
FIG. 2 is a diagram illustrating a method for performing a read of a flash memory using predicted RRD-compensated TVSO values.

FIG. 2 illustrates a method (100) for reading a flash memory using TVSO values identified using RRD-compensating RNNs. Configuration files for a plurality of RRD-compensating RNNs are stored (101). In one example each of a plurality of RRD-compensating RNN's is represented by a configuration file 23 that is stored in data storage 4 (FIG. 1). Alternatively, configuration files 23 for some or all of the RRD-compensating RNNs are stored in memory device 13 and/or in one or more flash memory devices 2. Though the present example uses a single configuration file for each RRD-compensating RNN it is appreciated that, alternatively, each RRD-compensating RNN could be represented by more than one configuration file. In one example, the configuration file for each RRD-compensating RNN includes a set of hyperparameters including weight and bias values. In one example the configuration file specifies the architecture of the particular RRD-compensating RNN such as, for example, the number of input neurons, number of output neurons, a number of layers of hidden neurons, a number of hidden neurons in each layer of hidden neurons and a type of activation function module (AFM) to be used.

Figure 3:
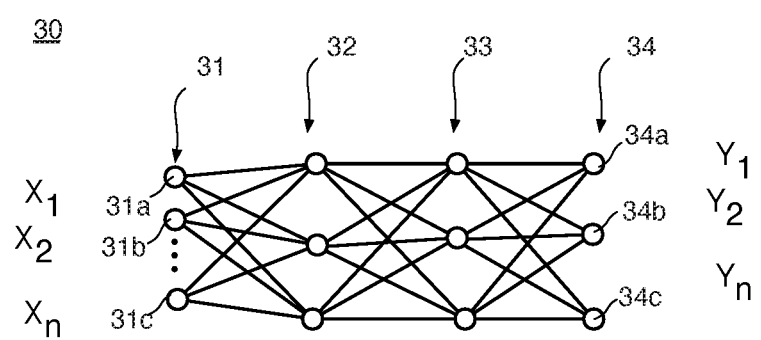
FIG. 3 is a block diagram illustrating an RRD-compensating RNN.

FIG. 3 illustrates an RRD-compensating RNN 30 that includes an input layer 31 that includes input neurons 31a-c that receive respective inputs X1 through Xn, hidden layers 32-33 that include hidden neurons and an output layer 34 that includes output neurons 34a-34c that generate respective outputs Y1-Yn. It is appreciated that RRD-compensating RNN 30 is an example and that many other combinations of input layer 31, hidden layers 32-33 and output layer 34 are possible, including layers with different connections between individual neurons, more hidden layers 32-33 and more or fewer neurons in each of the layers 31-34 of RRD-compensating RNN 30. For example, though RRD-compensating RNN 30 shows each neuron coupled to all of the neurons of the following layer, alternatively, each neuron in a particular layer is coupled to only some of the neurons in the following layer. In one example, RNN 30 includes a number of input neurons 31a-31c equal to the number of TVSO values required for reading the flash memory and includes a number of output neurons 34a-34c equal to the number of TVSO values required for reading the flash memory.

In one example RRD-compensating RNN 30 is generated by performing flash characterization testing to identify how the representative flash memory devices that are being tested perform under varying retention-time conditions and varying read-disturb conditions (together referred to as "transitory conditions"), where the varying retention-time and read-disturb conditions, i.e. the varying transitory conditions, are represented by corresponding transitory-reliability-states. The term "transitory-reliability-state" as used in the present application refers to a reliability state that includes the transitory characteristics of the flash memory devices, and specifically includes a reliability state in which the current number of program erase (PE) cycles, the retention time (RT) and the number of read disturbs (RD) are specified. The term "non-transitory-reliability-state" as used in the present application refers to a reliability state that relates to the non-transitory characteristics of the flash memory devices, and specifically only includes reliability states that have zero values for the transitory conditions of the flash memory devices (where RT=0 and RD=0). The term "reliability state," as used in the present application is an interval relating to age and usage of a memory location (e.g. a particular wordline/block/page) of a flash memory device that can be defined using measurements such as the number of PE cycles, RT and RD.

Figure 4A:
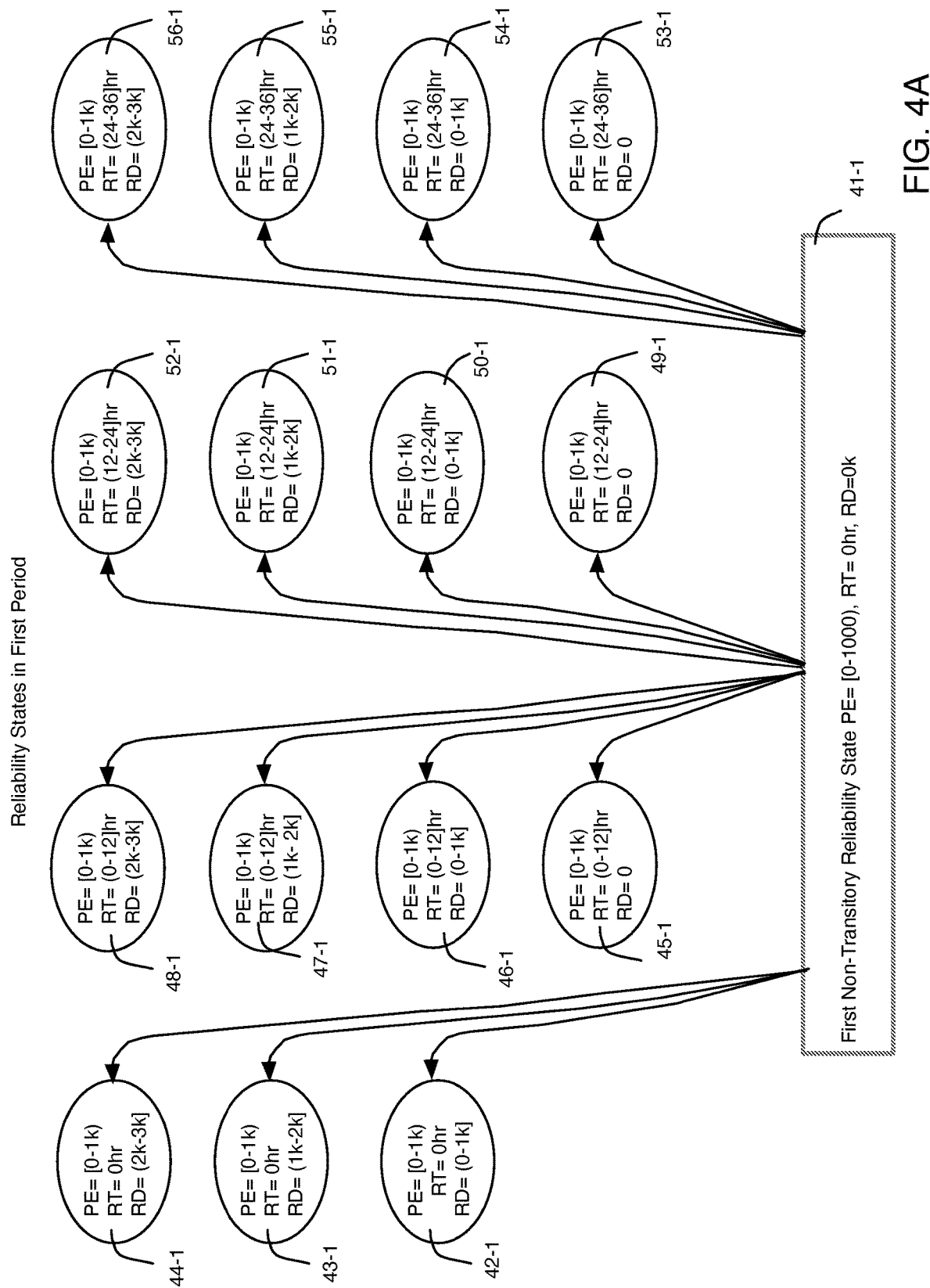
Figure 4B:
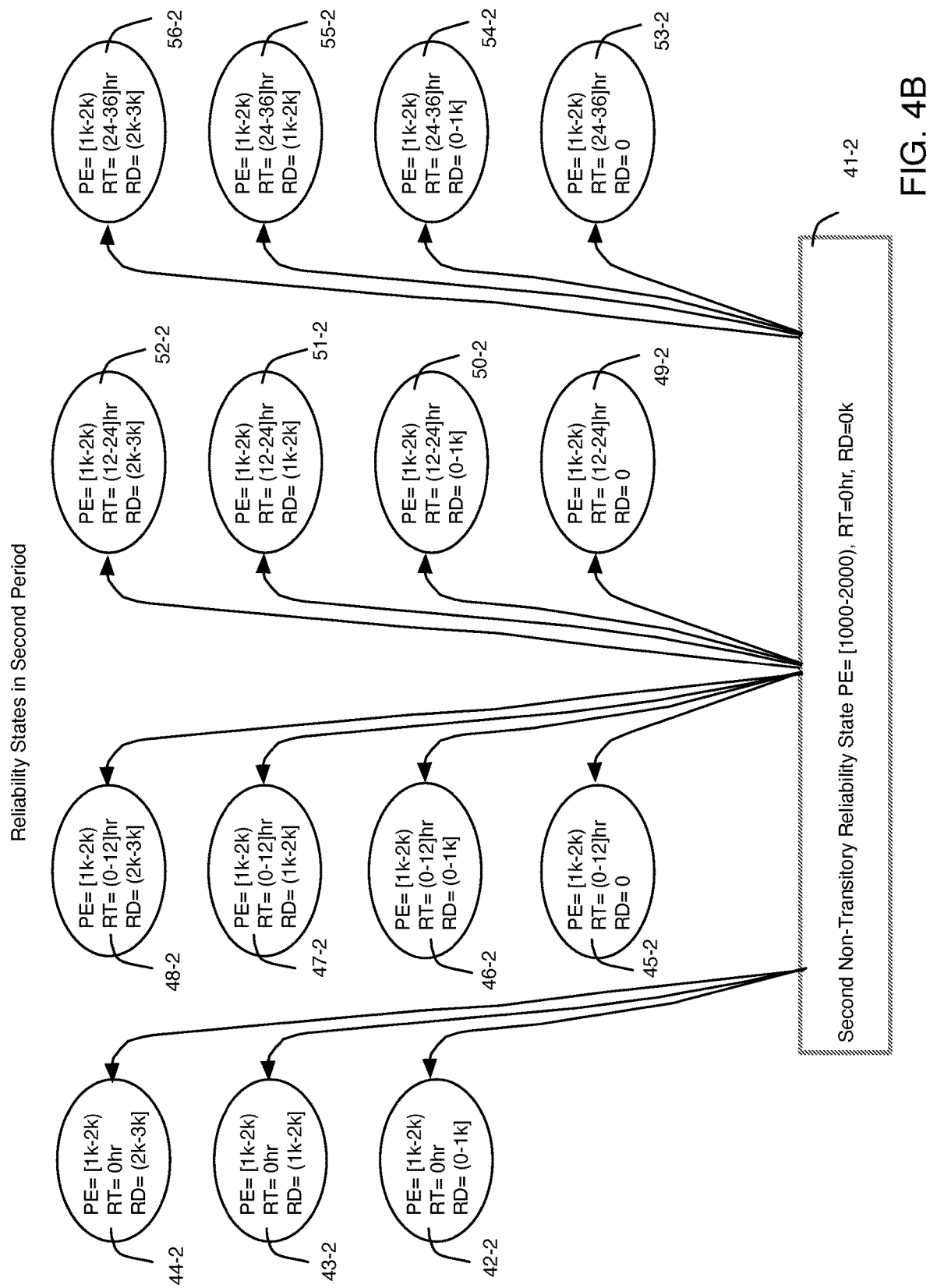
Figure 4D:
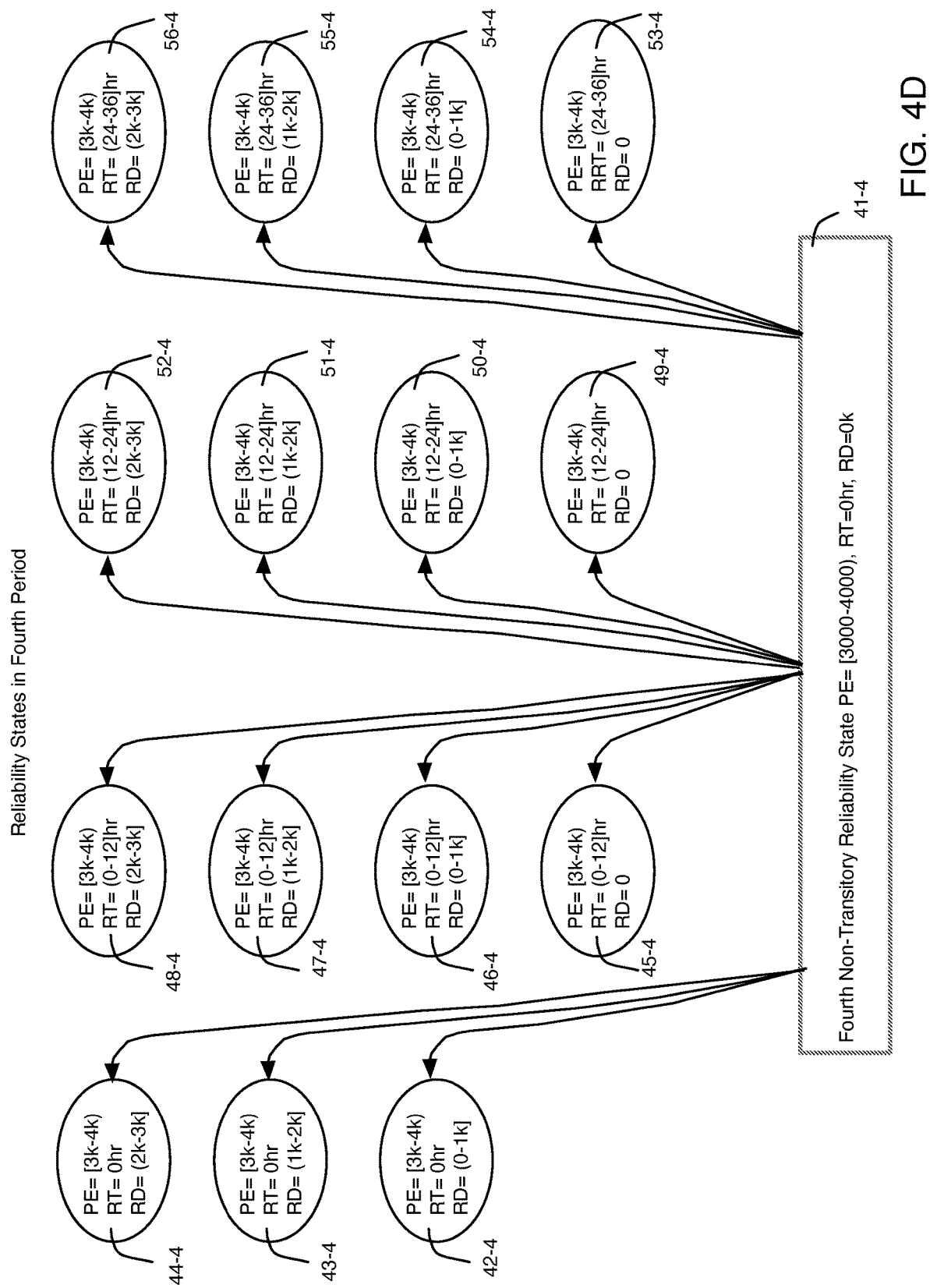
Figure 4E:
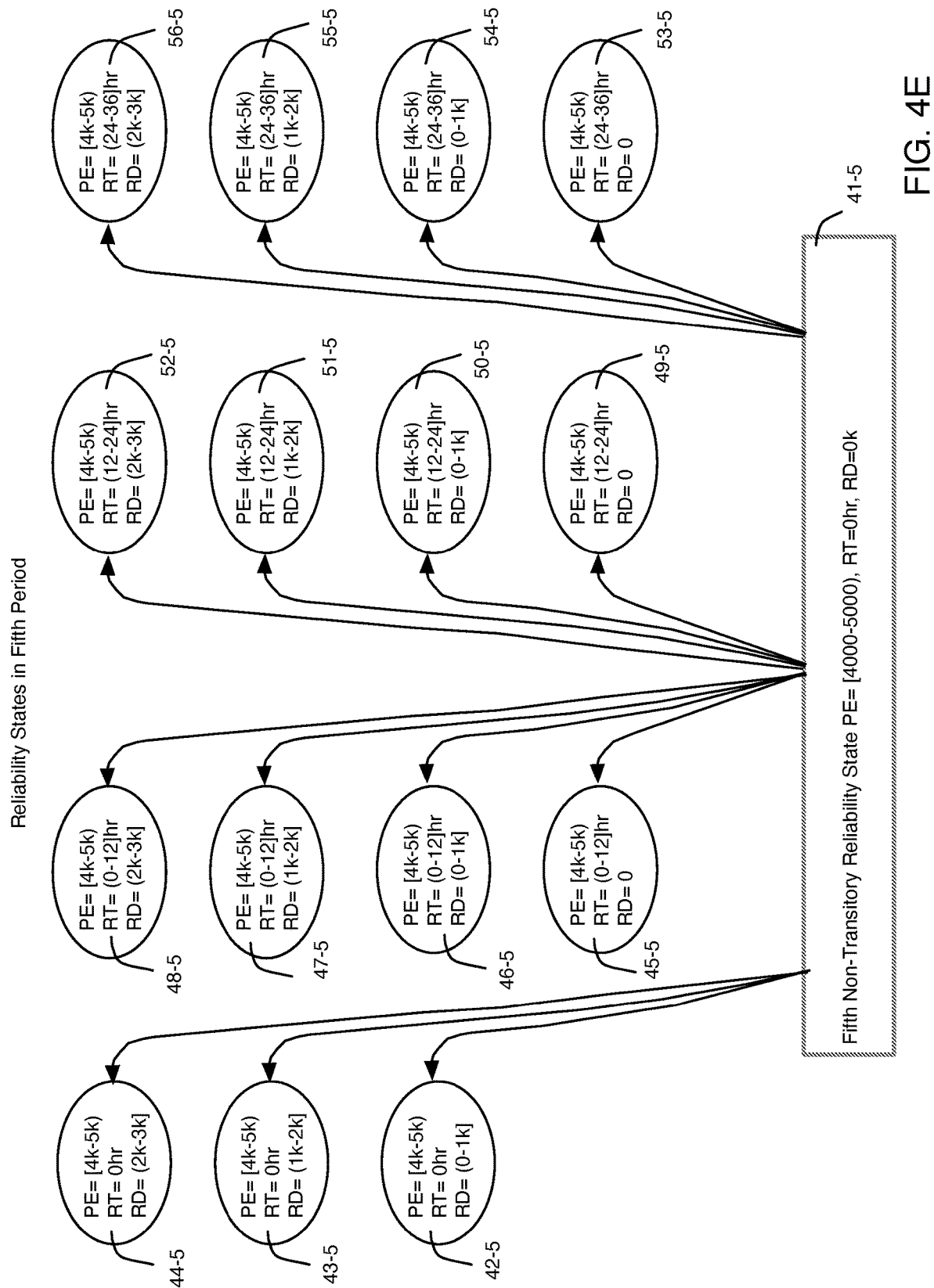

In one example, the lifetime of each flash memory 2 is divided into a plurality of periods based on the number of PE cycles in the lifetime of the flash memory and a set of RRD-compensating RNN's is associated with each of the plurality of periods. In one example that is illustrated in FIGS. 4A-4E, the lifetime of each flash memory 2 is divided into five periods based on lifetime, include a first period corresponding to $0 \leq PE<1000$ that is shown in FIG. 4A, a second period corresponding to $1000 \leq PE<2000$ that is shown in FIG. 4B, a third period corresponding to $2000 \leq PE<3000$ that is shown in FIG. 4C, a fourth period corresponding to $3000 \leq PE<4000$ that is shown in FIG. 4D, and a fifth period corresponding $4000 \leq PE<5000$ that is shown in FIG. 4E. A set of RRD-compensating RNN's is generated corresponding to each of the different periods, with each set of RRD-compensating RNN's trained using data records corresponding to the particular period.

In one example, retention time is divided into four retention-time (RT) categories and the number of read disturbs (RD) is divided into four categories. It is appreciated that these categories are illustrative and that more or fewer categories could be used.

Referring now to FIG. 4A these exemplary categories are used to define non-transitory-reliability-state 41-1 and transitory-reliability-states 42-1 through 56-1 shown in FIG. 4A that correspond to the first period. FIGS. 4A-4E denote PE, RT AND RD value ranges using parenthesis and brackets, where parentheses are used to denote exclusive values and brackets are used to denote inclusive values. FIG. 4A shows a first non-transitory-reliability-state 41-1 in which $0 \leq PE<1000$, RT=0 hours and RD=0 and a plurality of transitory-reliability-states. The transitory-reliability-states include a first transitory-reliability-state 42-1 in which $0 \leq PE<1000$, RT=0 hours and $0<RD \leq 1,000$, a second transitory-reliability-state 43-1 in which $0<PE<1000$, RT=0 hours and $1,000<RD \leq 2,000$, a third transitory-reliability-state 44-1 in which $0 \leq PE<1000$, RT=0 hours and $2,000<RD \leq 3,000$, a fourth transitory-reliability-state 45-1 in which $0 \leq PE<1000$, $0<RT \leq 12$ hours and RD=0 cycles, a fifth transitory-reliability-state 46-1 in which $0 \leq PE<1000$, $0<RT \leq 12$ hours and $0<RD \leq 1,000$ a sixth transitory-reliability-state 47-1 in which $0 \leq PE<1000$, $0<RT \leq 12$ hours and $1,000<RD \leq 2,000$, and seventh transitory-reliability-state 48-1 in which $0 \leq PE<1000$, $0<RT \leq 12$ hours and $2,000<RD \leq 3,000$, an eighth transitory-reliability-state 49-1 in which $0 \leq PE<1000$, $12<RT \leq 24$ hours and RD=0 cycles, a ninth transitory-reliability-state 50-1 in which $0 \leq PE<1000$, $12<RT \leq 24$ hours and $0<RD \leq 1,000$, an tenth transitory-reliability-state 51-1 in which $0 \leq PE<1000$, $12<RT \leq 24$ hours and $1,000<RD \leq 2,000$, an eleventh transitory-reliability-state 52-1 in which $0 \leq PE<1000$, $12<RT \leq 24$ hours and $2,000<RD \leq 3,000$, a twelfth transitory-reliability-state 53-1 in which $0 \leq PE<1000$, $24<RT \leq 36$ hours and RD=0 cycles, a thirteenth transitory-reliability-state 54-1 in which $0 \leq PE<1000$, $24<RT \leq 36$ hours and $0<RD \leq 1,000$, a fourteenth transitory-reliability-state 55-1 in which $0 \leq PE<1000$, $24<RT \leq 36$ hours and $1,000<RD \leq 2,000$, and a fifteenth transitory-reliability-state 56-1 in which $0 \leq PE<1000$, $24<RT \leq 36$ hours and $2,000<RD \leq 3,000$. In the present example, each of transitory-reliability-states 42-1 through 56-1 is represented by a single neural network that is stored as an RDD-compensating configuration file 23 in FIG. 1. FIG. 4B shows non-transitory-reliability-state 41-2 in which $1000 \leq PE<2000$, RT=0 and RD=0 and transitory-reliability-states 42-2 through 56-2 that correspond to the second period. FIG. 4C shows non-transitory-reliability-state 41-3 in which $2000 \leq PE<3000$ and transitory-reliability-states 42-3 through 56-3 that correspond to the third period. FIG. 4D shows non-transitory-reliability-state 41-4 in which $3000 \leq PE<4000$ and transitory-reliability-states 42-4 through 56-4 that correspond to the fourth period. FIG. 4E shows non-transitory-reliability-state 41-5 in which $4000 \leq PE<5000$ and transitory-reliability-states 42-5 through 56-5 that correspond to the fifth period.

In one example, during flash characterization testing, one or more representative NAND flash memory is cycled to reach one of the non-transitory-reliability-states and the TVSO values minimizing the raw bit error rate (RBER) are calculated for all of the wordlines of all the blocks to generate a training dataset. The one or more representative NAND flash memory is then stressed through all the corresponding transitory-reliability-states and, for each transitory-reliability-state, TVSO values minimizing the RBER are calculated for all the wordlines of all the blocks.

In one example shown in FIG. 5 the representative flash memory device is cycled to a number of PE cycles "x" within a respective non-transitory reliability state and testing is performed at each wordline of all the blocks to identify TVSO values minimizing RBER to generate a data record 61 for the particular wordline and block. In one specific example 384 wordlines of 100 blocks are tested to generate 38,400 data records 61 for the non-transitory-reliability-state and RT and RD are cycled through the respective transitory reliability states to generate data records 62-76. A set of data records 61-76 will be generated for each of the periods illustrated in FIGS. 4A-4E. The data records 61-76 each show 7 TVSO values which is representative of the number of TVSO values needed for a triple level cell, however this is not meant to be limiting in any way.

Following is an example of data records generated for the first period shown in FIG. 4A. The representative flash memory device is cycled to a number of PE cycles equal to 500 (the midpoint for the non-transitory reliability state) and testing is performed at each wordline of all the blocks to identify TVSO values minimizing RBER to generate a data record 61 for the particular wordline and block (e.g., a total of 38,400 data records 61). Then the number of read disturbs is cycled to 500 (the midpoint for the transitory-reliability-state 42-1 of FIG. 4A) and testing is performed at each wordline of all the blocks to identify TVSO values minimizing RBER to generate data records 62 for the first transitory-reliability-state (e.g., 38,400 data records 62); the number of read disturbs is cycled to 1500 (the midpoint for the transitory-reliability-state 43-1 of FIG. 4A) and testing is performed at each wordline of all the blocks to identify TVSO values minimizing RBER to generate data records 63 for the second transitory-reliability-state (e.g., 38,400 data records 63); and the number of read disturbs is cycled to 2500 (the midpoint for the state 44-1 of FIG. 4A) and testing is performed at each wordline of all the blocks to identify TVSO values minimizing RBER to generate data records 64 for the third transitory-reliability-state (e.g., 38,400 data records 64). The read disturbs are then reset to 0, and retention time is cycled to 6 hours (the midpoint for the transitory-reliability-state 45-1 of FIG. 4A) and testing is performed at each wordline and block to identify TVSO values minimizing RBER to generate data records 65 for the fourth transitory-reliability-state (e.g., 38,400 data records 65); RD is cycled to 500 (the midpoint for the state 46-1 of FIG. 4A) and testing is performed at each wordline and block to identify TVSO values minimizing RBER to generate data records 66 for the fifth transitory-reliability-state (e.g., 38,400 data records 66); RD is cycled to 1500 (the midpoint for the transitory-reliability-state 47-1 of FIG. 4A) and testing is performed at each wordline and block to identify TVSO values minimizing RBER to generate data records 67 for the sixth transitory-reliability-state (e.g., 38,400 data records 67); RD is cycled to 2500 (the midpoint for the state 48-1 of FIG. 4A) and testing is performed at each wordline and block to identify TVSO values minimizing RBER to generate data records 68 for the seventh transitory-reliability-state (e.g., 38,400 data records 68). The process is continued in the same manner to generate data records 69-76 corresponding to transitory-reliability-states 49-1 through 56-1. In the present example, seven TVSO values minimizing RBER are calculated and included in each data record 61-76, along with an indication of the wordline (WL) such as a wordline index and an indicator of the block (e.g., a block number). The term "wordline index," as used in the present application, is a numeric or alphanumeric value that identifies one of the wordlines of a flash memory device. Though the number of program and erase cycles increases from x to x+3 cycles during the testing (these cycles are needed to reset retention and read disturb effects), the change in PE is insignificant and can be disregarded. The TVSO values minimizing RBER in respective data records 61-76 for non-transitory-reliability-state 41-1 and transitory-reliability-states 42-1 through 56-1 are illustrated respectively as 61$a$, 62$a$, 63$a$, 64$a$, 65$a$, 66$a$, 67$a$, 68$a$, 69$a$, 70$a$, 71$a$, 72$a$, 73$a$, 74$a$, 75$a$ and 76$a$ in FIG. 6A. 61$a$ is repeated adjacent each of 62$a$, 63$a$, 64$a$, 65$a$, 66$a$, 67$a$, 68$a$, 69$a$, 70$a$, 71$a$, 72$a$, 73$a$, 74$a$, 75$a$ and 76$a$ for ease of understanding. The TVSO values minimizing RBER in respective data records 61-76 for non-transitory-reliability-state 41-2 and transitory-reliability-states 42-2 through 56-2 of FIG. 4B are illustrated respectively as 61$b$, 62$b$, 63$b$, 64$b$, 65$b$, 66$b$, 67$b$, 68$b$, 69$b$, 70$b$, 71$b$, 72$b$, 73$b$, 74$b$, 75$b$ and 76$b$ in FIG. 6B. The TVSO values minimizing RBER in respective data records 61-76 for non-transitory-reliability-state 41-3 and transitory-reliability-states 42-3 through 56-3 of FIG. 4C are illustrated respectively as 61$c$, 62$c$, 63$c$, 64$c$, 65$c$, 66$c$, 67$c$, 68$c$, 69$c$, 70$c$, 71$c$, 72$c$, 73$c$, 74$c$, 75$c$ and 76$c$ in FIG. 6C. The TVSO values minimizing RBER in respective data records 61-76 for non-transitory-reliability-state 41-4 and transitory-reliability-states 42-4 through 56-4 of FIG. 4D are illustrated respectively as 61$d$, 62$d$, 63$d$, 64$d$, 65$d$, 66$d$, 67$d$, 68$d$, 69$d$, 70$d$, 71$d$, 72$d$, 73$d$, 74$d$, 75$d$ and 76$d$ in FIG. 6D. The TVSO values minimizing RBER in respective data records 61-76 for non-transitory-reliability-state 41-5 and transitory-reliability-states 42-5 through 56-5 of FIG. 4E are illustrated respectively as 61$e$, 62$e$, 63$e$, 64$e$, 65$e$, 66$e$, 67$e$, 68$e$, 69$e$, 70$e$, 71$e$, 72$e$, 73$e$, 74$e$, 75$e$ and 76$e$ in FIG. 6E.

For each period, the data record corresponding to the non-transitory-reliability-state is used to train each of the RRD-compensating RNN's and the data records corresponding to one of the transitory-reliability-states is used as the target data set in the training. In one example, some of the records corresponding to the particular transitory-reliability state are used for verification and after the RRD-compensating RNN's are trained and verified a configuration file 23 for the trained RRD-compensating RNN is stored. The configuration file 23 includes hyperparameters (bias values and weighting values) corresponding to the trained RRD-compensating RNN 30. The configuration file 23 can also indicate the architecture of the neural network. In one example training uses TVSO values 61$a$ from data records 61 as a training data set to train a first neural network 42-1$m$ (that corresponds to reliability state 42-1) using TVSO values 62$a$ from data records 62 as a target data set. The training can use a stochastic gradient descent (SGD) training process, performed to achieve predetermined performance criteria (e.g., a min-squared error value) for TVSO values responsive to perturbance of the transitory conditions. Alternatively, other types of training processes can be used such as, for example, an adaptive moment estimation (ADAM) training process. Continuing with FIG. 6A, training to form RDD-compensating RNN 43-1$m$ through 56-1$m$ is performed in the same manner. More particularly, second neural network 43-1$m$ is trained using TVSO values 61$a$ from data records 61 as a training data set and using TVSO values 63$a$ from data records 63 as a target data set; third neural network 44-1$m$ is trained using TVSO values 61$a$ from data records 61 as a training data set and using TVSO values 64$a$ from data records 64 as a target data set; fourth neural network 45-1$m$ is trained using TVSO values 61$a$ from data records 61 as a training data set and using TVSO values 65$a$ from data records 65 as a target data set; fifth neural network 46-1$m$ is trained using TVSO values 61$a$ from data records 61 as a training data set and using TVSO values 66$a$ from data records 66 as a target data set; sixth neural network 47-1$m$ is trained using TVSO values 61$a$ from data records 61 as a training data set and using TVSO values 67$a$ from data records 67 as a target data set; seventh neural network 48-1$m$ is trained using TVSO values 61$a$ from data records 61 as a training data set and using TVSO values 68$a$ from data records 68 as a target data set; eighth neural network 49-1$m$ is trained using TVSO values 61$a$ from data records 61 as a training data set and using TVSO values 69$a$ from data records 69 as a target data set; ninth neural network 50-1$m$ is trained using TVSO values 61$a$ from data records 61 as a training data set and using TVSO values 70$a$ from data records 70 as a target data set; tenth neural network 51-1$m$ is trained using TVSO values 61$a$ from data records 61 as a training data set and using TVSO values 71$a$ from data records 71 as a target data set; eleventh neural network 52-1$m$ is trained using TVSO values 61$a$ from data records 61 as a training data set and using TVSO values 72$a$ from data records 72 as a target data set; twelfth neural network 53-1$m$ is trained using TVSO values 61$a$ from data records 61 as a training data set and using TVSO values 73$a$ from data records 73 as a target data set; thirteenth neural network 54-1$m$ is trained using TVSO values 61$a$ as a training data set and using TVSO values 74$a$ as a target data set; fourteenth neural network 55-1$m$ is trained using TVSO values 61$a$ from data records 61 as a training data set and using TVSO values 75$a$ as a target data set; fifteenth neural network 56-1$m$ is trained using TVSO values 61$a$ as a training data set and using TVSO values 76$a$ as a target data set.

Figure 6A:
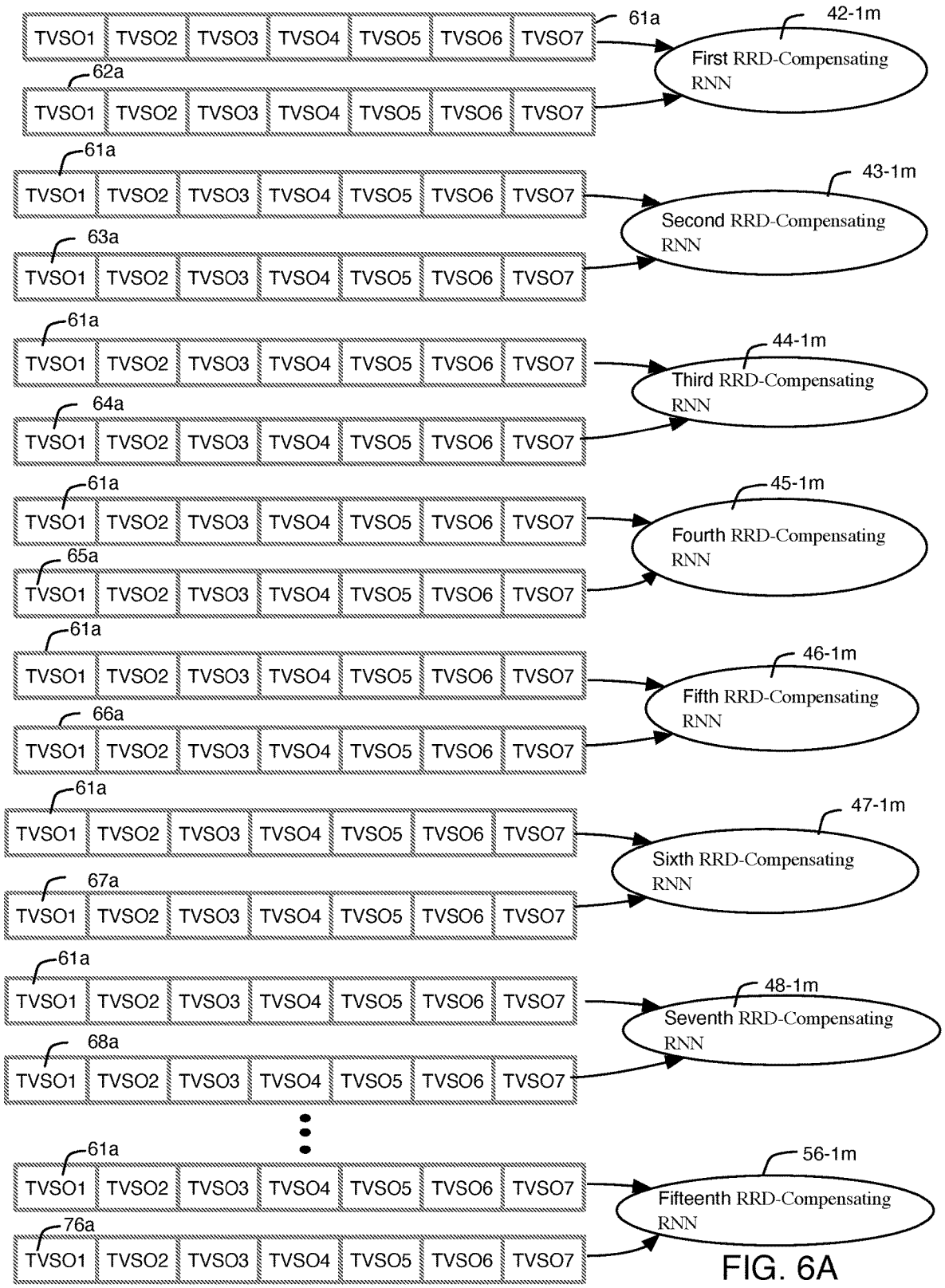
FIG. 6A-6E are block diagrams illustrating generation of RRD-compensating RNN's corresponding to the reliability states shown in FIGS. 4A-4E.
Figure 6B:
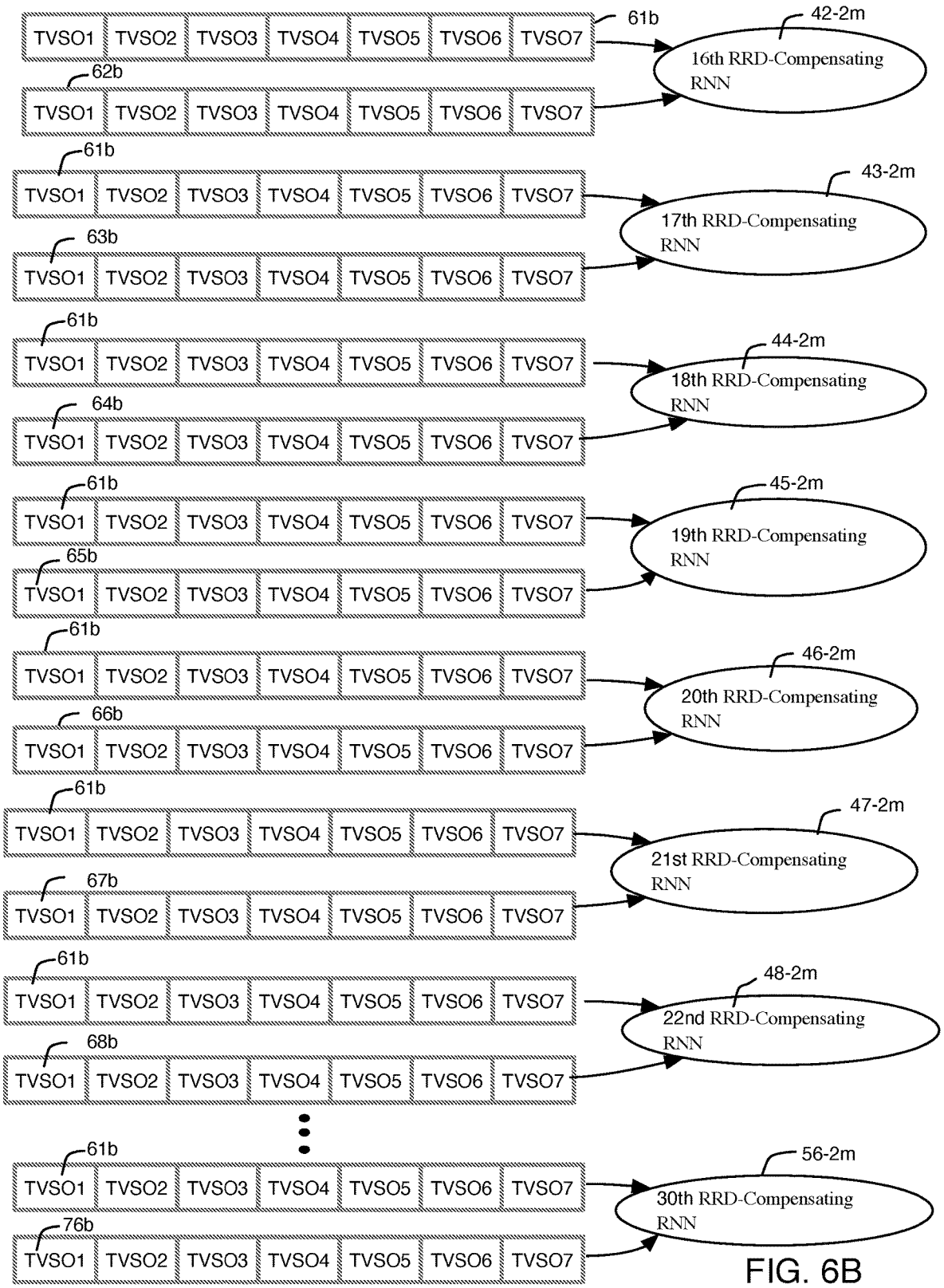

Referring now to FIG. 6B, TVSO values 61$b$ corresponding to non-transitory-reliability-state 41-2 and TVSO values 62$b$, 63$b$, 64$b$, 65$b$, 66$b$, 67$b$, 68$b$, 69$b$, 70$b$, 71$b$, 72$b$, 73$b$, 74$b$, 75$b$ and 76$b$ corresponding to transitory-reliability-states are used to train RRD-compensating RNN's in the same manner as discussed with reference to FIG. 6A, forming RRD-compensating RNN's 42-2$m$ through 56-2$m$, each of which is stored as a configuration file 23.

Figure 6C:
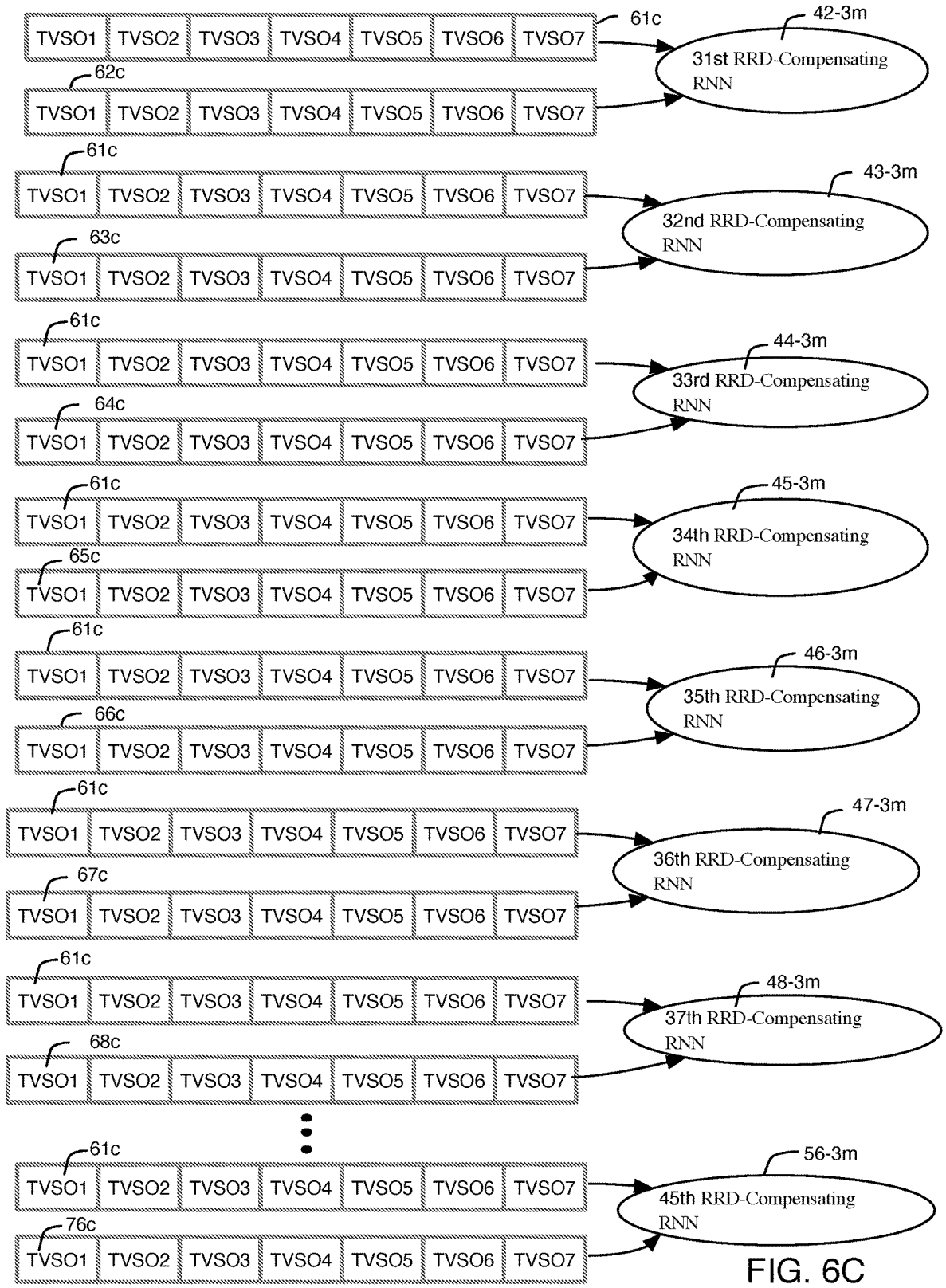
Figure 6D:
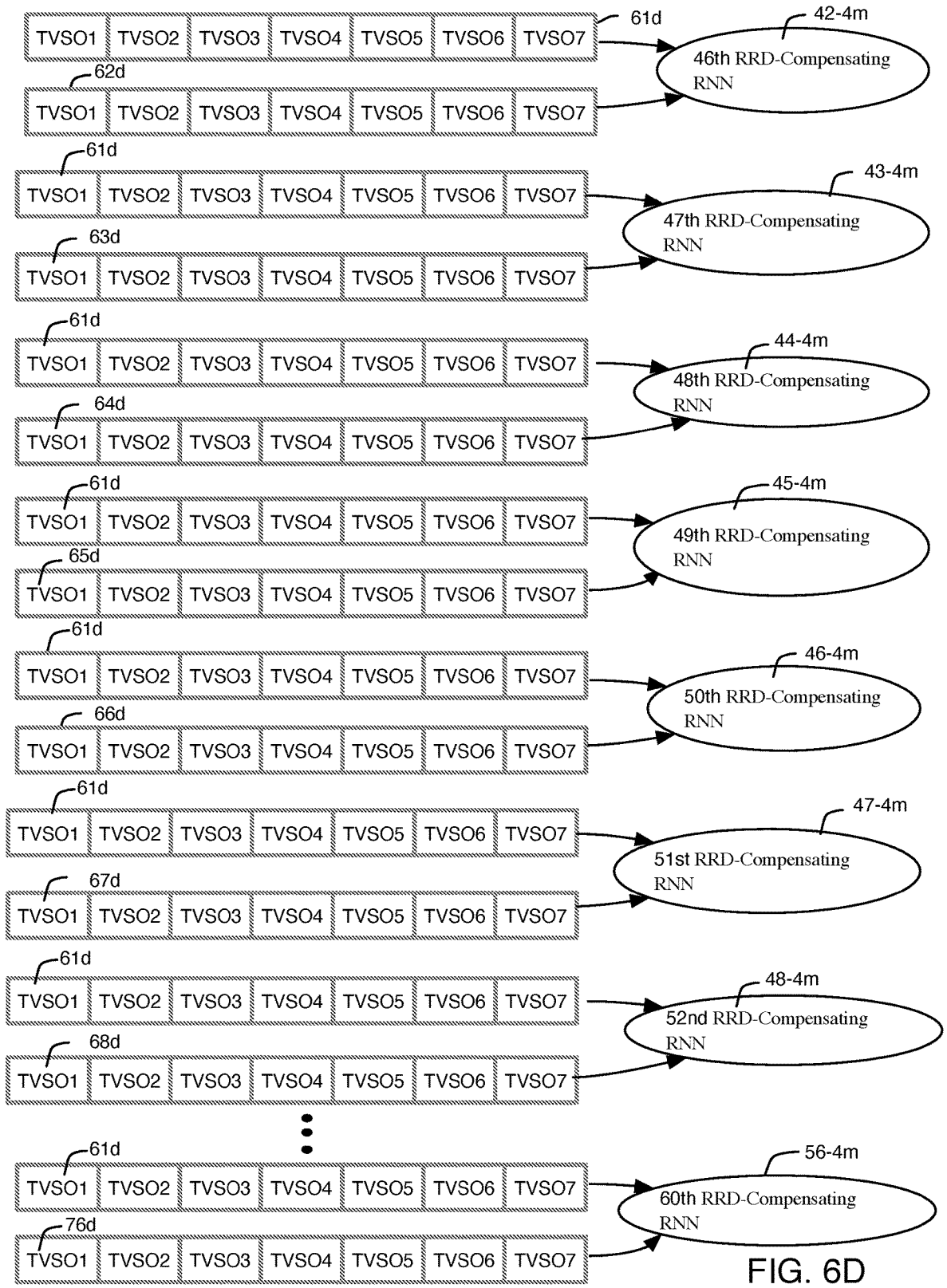
Figure 6E:
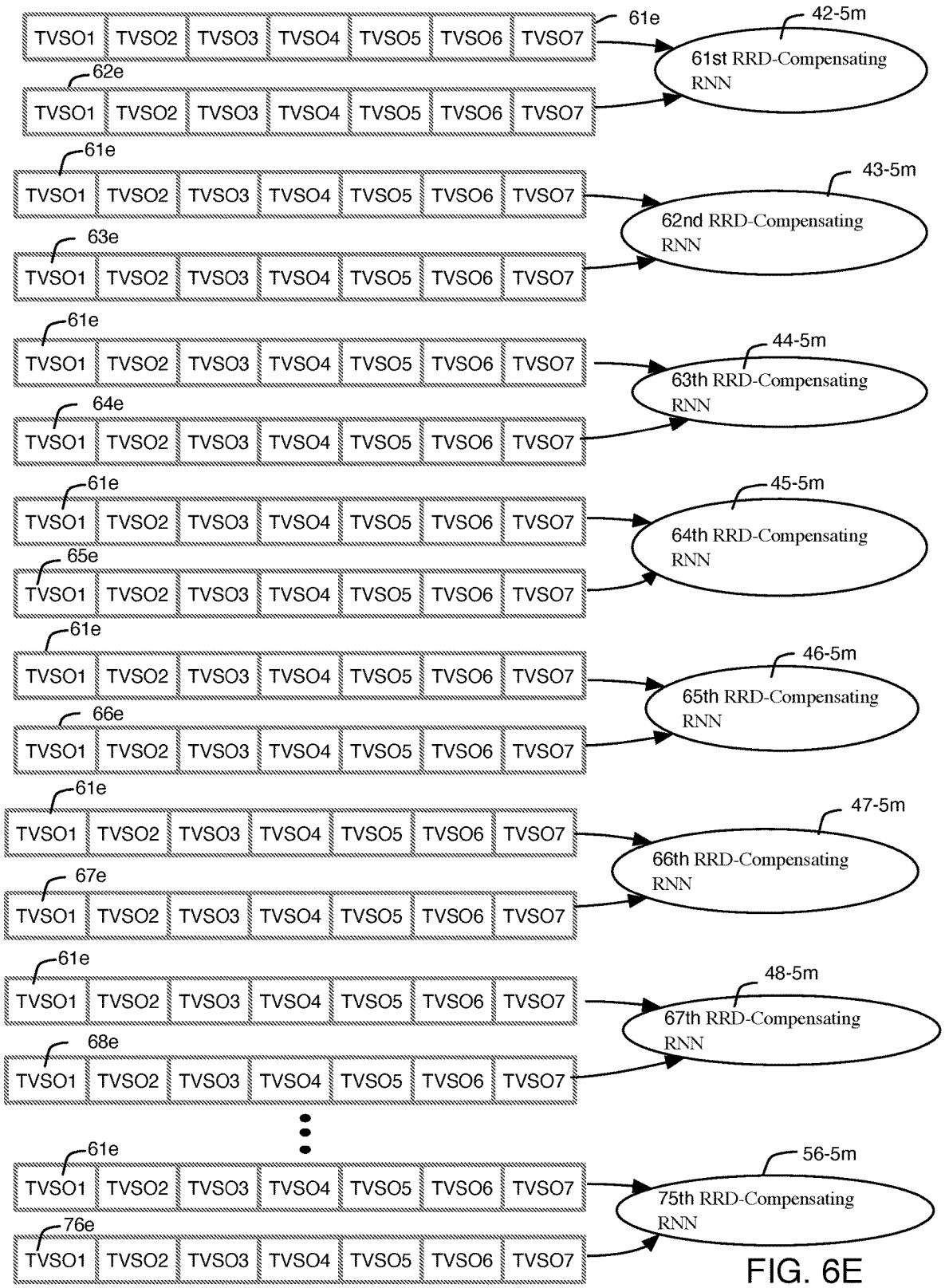

Referring now to FIG. 6C, TVSO values 61$c$ corresponding to non-transitory-reliability-state 41-3 and TVSO values 62$c$, 63$c$, 64$c$, 65$c$, 66$c$, 67$c$, 68$c$, 69$c$, 70$c$, 71$c$, 72$c$, 73$c$, 74$c$, 75$c$ and 76$c$ corresponding to transitory-reliability-states are used to train RRD-compensating RNN's in the same manner as discussed with reference to FIG. 6A-6B, forming RRD-compensating RNN's 42-3$m$ through 56-3$m$, each of which is stored as a configuration file 23. Referring now to FIG. 6D, TVSO values 61*d* corresponding to non-transitory-reliability-state 41-4 and TVSO values 62*d*, 63*d*, 64*d*, 65*d*, 66*d*, 67*d*, 68*d*, 69*d*, 70*d*, 71*d*, 72*d*, 73*d*, 74*d*, 75*d* and 76*d* corresponding to transitory-reliability-states are used to train RRD-compensating RNN's in the same manner as discussed with reference to FIG. 6A-6C, forming RRD-compensating RNN's 42-4*m* through 56-4*m*, each of which is stored as a configuration file 23. Referring now to FIG. 6E, TVSO values 61*e* corresponding to non-transitory-reliability-state 41-5 and TVSO values 62*e*, 63*e*, 64*e*, 65*e*, 66*e*, 67*e*, 68*e*, 69*e*, 70*e*, 71*e*, 72*e*, 73*e*, 74*e*, 75*e* and 76*e* corresponding to transitory-reliability-states are used to train RRD-compensating RNN's in the same manner as discussed with reference to FIG. 6A-6D, forming RRD-compensating RNN's 42-5*m* through 56-5*m*, each of which is stored as a configuration file 23.

Thus, in the present example, since there are 15 RRD-compensating RNNs corresponding to each period and there are five periods, a total of 75 different RRD-compensating RNN's are generated. However, alternatively, more or fewer periods could be used and more or fewer transitory-reliability states could be used.

Continuing with FIG. 2, a current number of PE cycles of the flash memory is identified (102). Status module 5 of FIG. 1 is configured to identify the current number of PE cycle values by maintaining a count of the current number of PE cycles for the flash memory device 2 (e.g., for each block of each flash memory device 2) and store the current number of PE cycles (e.g., for each block of each flash memory device 2) in registers of status module 5 or in a table stored in data storage 4 or in memory device 13.

TVSO values corresponding to the current number of PE cycles are identified (103). The identified TVSO values can be the TVSO values specified by the manufacturer of the flash memory for the current number of PE cycles of the flash memory 2. In one example, the identified TVSO values are the TVSO values specified by the manufacturer for the current number of PE cycles and for a particular block and/or wordline and/or page of flash memory device 2.

In one example, step 103 is performed using a PE-TVSO lookup table that includes PE cycle values and associated TVSO values. The PE-TVSO table can also specify TVSO values corresponding to blocks and/or pages and/or wordlines or groups of blocks and/or groups of wordlines and/or groups of pages as is known in the art. In this example, a PE-TVSO lookup table 24 is stored in data storage 4 of FIG. 1 or in memory device 13. The TVSO values identified in step 103 that may be referred to as "non-transitory TVSO values" corresponding to the age/usage of the flash memory device 2. The term "non-transitory TVSO values" as used in the present application includes TVSO values that correspond to the number of PE cycles, and that do not take into account transitory characteristics such as retention time and read disturb.

In one example of step 103, the five periods corresponding to non-transitory-reliability-states 41-1, 41-2, 41-3, 41-4 and 41-5 shown in FIGS. 5A-5E are also used to build the PE-TVSO lookup table 24 shown in FIG. 1, which is stored in data storage 4. More particularly, during flash characterization, representative flash devices that are similar to flash memory devices 2 are tested under a variety of conditions to determine the best TVSO values to use to perform a read during each of the periods. In one example of step 103, the current number of PE cycles identified in step 103 is between zero and 1,000 PE cycles such that the TVSO values will correspond to the first period that is represented by block 41-1 in FIG. 5A, that corresponds to PE=0-1000.

A current retention time and a current number of read disturbs for the flash memory are identified (104). Status module 5 of FIG. 1 is configured for identifying a current retention time and a current number of read disturbs for a flash memory 2. The current retention time and current number of read disturbs represent the transitory characteristics of each location that is to be read in the flash memory device 2. In one example, each time that a block is closed, status module 5 is operable to count the number of reads of the block while the block is closed and the number of reads of the block while the block is closed is stored as a read disturb value. When a block is erased, the read disturb value of the erased block is reset to zero. In one example the current retention time is a closed-block retention time, and each time that a block is closed, status module 5 is operable to start a timer to determine the amount of time that has elapsed since the block was closed. The elapsed time as determined by the timer at any point in time is defined as the current retention time for the particular block. When a block is erased the timer for that block is stopped and the closed-block retention time value of the erased block is reset to zero. In one example, control module 9 is operable to send a query to status module 5 indicating a block number and in response status module 5 is operable to indicate the current retention time and current number of read disturbs for the particular block.

The configuration file of the RRD-compensating RNN corresponding to the current number of PE cycles, the current retention time and current number of read disturbs for the flash memory is selected (105) and the selected configuration file of the RRD-compensating RNN is loaded (106) into a neural network engine to form an RNN core in the neural network engine. In one example control module 9 of FIG. 1 is configured to select the configuration file of the RRD-compensating RNN 23 associated with the current number of PE cycles, the current RT and the current RD and load the selected RRD-compensating RNN configuration file 23 into the neural network engine 10 to form an RNN core in the neural network engine 10. In the example shown in FIG. 4, the RRD-compensating RNN configuration file 23 corresponding to one of transitory-reliability states 42-1 through 56-1, 42-2 through 56-2, 42-3 through 56-3, 42-4 through 56-4 or 42-15 through 56-5 is selected in step 105 and loaded in step 106. In one example, a configuration-file-lookup table 26 is stored in data storage 4 that includes an indication of a number of PE cycles, a RT and RD and indicates, for each particular indication of a number of PE cycles, RT and RD, an identifier of an associated RRD-compensating RNN configuration file 23. The identifier of the associated RRD-compensating RNN configuration file 23 can be in the form of an index that identifies the RRD-compensating RNN configuration file 23 or an address indicating where the RRD-compensating RNN configuration file 23 is stored. In one example, control module 9 is operable in step 105 to performing a lookup in configuration-file-lookup table 26 using the current number of PE cycles, the current retention time and the current number of read disturbs of a particular block to identify the address in data storage 4 where the RRD-compensating RNN configuration file 23 to use is stored and the address in data storage 4 is utilized to obtain the RRD-compensating RNN configuration file 23 to be loaded into neural network engine 10.

In one example, configuration-file-lookup table 26 includes an indication of a number of PE cycles, RT and RD and indicates, for each particular indication of the number of PE cycles, RT and RD an identifier of an associated RRD-compensating RNN configuration file 23. The identifier of the associated RRD-compensating RNN configuration file 23 can be in the form of an index that identifies the RRD-compensating RNN configuration file 23 or an address indicating where the RRD-compensating configuration file 23 is stored. In one example, control module 9 is operable in step 105 to performing a lookup in configuration-file-lookup table 26 using the current number of PE cycles, the current RT and the current RD of a particular block to identify the address in data storage 4 where the configuration file 23 to use is stored and the address in data storage 4 is utilized to obtain the RRD-compensating RNN configuration file 23 to be loaded into the neural network engine 10.

In one example the architecture of the neural network engine 10 is fixed, predetermined, or is otherwise established prior to starting method 100 and each of the stored RRD-compensating RNNs have the same number of input neurons, output neurons, connections between neurons and use the same activation functions such that the selecting and loading of steps 105-106 require only the selection and loading of bias values and weighting values into neural network 10. In one example, neural network engine 10 includes configurable logic and the neural network engine is configured in accordance with an architecture that is common to each of the RRD-compensating RNNs prior to performing step 101.

Figure 7:
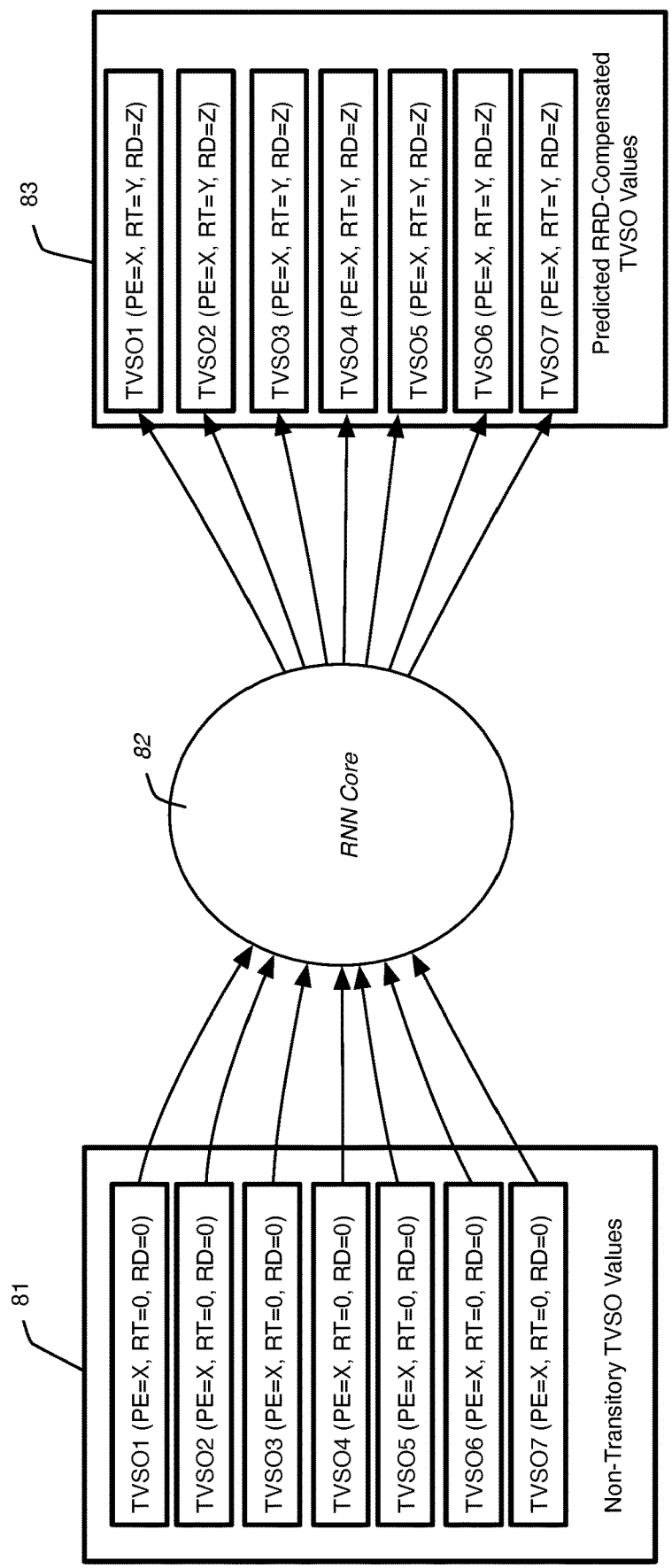
FIG. 7 is a block diagram illustrating a neural network operation of an RRD-compensating RNN.

A neural network operation of the RNN core is performed (107) to predict RRD-compensated TVSO values, the input to the neural network operation including the identified TVSO values corresponding to the current number of PE cycles of the flash memory. In one example, neural network engine 10 is operable to perform a neural network operation of the RNN core to predict RRD-compensated TVSO values, the input to the neural network operation comprising the identified TVSO values corresponding to the current number of PE cycles of the flash memory 2. FIG. 7 shows an example of step 107 in which input 81 into the neural network operation of RNN core 82 includes seven TVSO values (TVSO1, TVSO2, TVS03, TVSO4, TVSO5, TVSO6 and TVSO7) to generate seven predicted RRD-compensated TVSO values 83 at the output neurons of RNN core 82, where y represents the retention time and z represents the number of read disturbs that were compensated for in the neural network operation. The perturbance of the transitory conditions, i.e. the retention time and read disturbs, is taken into account by the selection of the appropriate RRD-compensating RNN, i.e. the selection in step 105 of the appropriate RRD-compensating RNN configuration file 23.

Optionally, the predicted RRD-compensated TVSO values 83 are stored (108). In one example, control module 9 is optionally operable to store the predicted RRD-compensated TVSO values 83 in data storage 4 or in memory device 13. In one example, the predicted RRD-compensated TVSO values 83 are stored in a TVSO-read lookup table 25 that is stored in data storage 4. In one example, TVSO-read lookup table 25 includes an indication of a wordline index, a block number (and optionally a page indicator) and, for each indication of a wordline index and block number (and optional page indicator), the associated RRD-compensated TVSO values to be used for reading that wordline/block/page.

Steps 102-108 are optionally repeated (109). In one example, steps 102-108 are repeated each time that the current number of PE cycles reaches a predetermined PE cycle threshold, RT reaches a predetermined retention-time threshold, or the current RD reaches a read-disturb threshold. In one example, control module 9 is configured to determine when the current number of PE cycles reaches a predetermined PE cycle threshold, when the current RT reaches a predetermined retention-time threshold and when the current RD reaches a read-disturb threshold, and each time the current number of PE cycles reaches a predetermined PE cycle threshold, the current RT reaches a predetermined retention-time threshold or the current RD reaches a read-disturb threshold: the control module 9 is operable to repeat the identifying a current number of PE cycles, the identifying TVSO values, the identifying a current RT and RD, the selecting the configuration file 23 and the loading the selected configuration file 23, the neural network engine 10 is operable to repeat the performing a neural network operation of the RNN core to predict the RRD-compensated TVSO values, and the control module is configured to repeat the updating the TVSO values to be used for reading the flash memory 2 by replacing at least some of the TVSO values to be used for reading the flash memory 2 stored in the TVSO-read lookup table 25 with the predicted RRD-compensated TVSO values so as to keep the values in TVSO-read lookup table 25 current (corresponding to the current transitory-reliability-state). In one example, a plurality of PE cycle thresholds are used, including a PE cycle threshold corresponding to each of the periods used to generate the RRD-compensating RNN's (corresponding to the non-transitory-reliability-states used to generate the RDD-compensating RNN's) such that the predicted RRD-compensated TVSO values stored in the TVSO-read lookup table correspond to the current period in the lifetime of the flash memory 2. In one example, a plurality of retention time thresholds are used (including a retention time threshold corresponding to the retention time limits of each of the transitory-reliability states) and a plurality of read disturb thresholds are used (including a read-disturb threshold corresponding to the read disturb limits of each of the transitory-reliability states used to generate the RRD-compensating RNN's) such that the predicted RRD-compensated TVSO values stored in the TVSO-read lookup table correspond to the current transitory-reliability-state of the flash memory 2.

A read of the flash memory is performed (110) using the predicted RRD-compensated TVSO values. In one example, read module 6 of FIG. 1 is configured to perform a read of the flash memory 2 using the predicted RRD-compensated TVSO values. In one example, step 103 includes identifying at the flash controller TVSO values corresponding to the current number of PE cycles for a page of the flash memory 2 that is to be read in step 110 such that the RRD-compensated TVSO values predicted in step 107 and used to perform the read of step 110 are RRD-compensated TVSO values for the page of the flash memory to be read.

In one example, in response to a receiving a read instruction that identifies a read address: the status module 5 is operable to identify a current number of PE cycles, current RT and current RD corresponding to the read address, the read module 6 is configured to perform a lookup in the TVSO-read lookup table 25 to identify a current set of TVSO values corresponding to the read address, the current number of PE cycles, the current RT, and the current RD, and the read module is configured to perform the read of the flash memory 2 in step 110 using the identified current set of TVSO values.

The present method and apparatus does not require background reads of flash memories 2 to identify the TVSO values to be used for performing reads of flash memories 2. Accordingly, the bandwidth that conventional SSDs that require reads of flash memories 2 require for performing background reads is available to flash memory devices 2, resulting in performance improvement as compared to conventional SSD's that require background reads for identifying TVSO values to be used for performing reads.

In the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

The invention claimed is:

1. A method for performing a read of a flash memory comprising:
    storing configuration files for a plurality of retention-and-read-disturb (RRD)-compensating regression neural networks (RNNs);
    identifying current number of program and erase (PE) cycles for the flash memory;
    identifying threshold voltage shift offset (TVSO) values corresponding to a non-transitory-reliability-state that corresponds to the identified current number of PE cycles of the flash memory;
    identifying a current retention time and a current number of read disturbs for the flash memory;
    selecting the configuration file of the plurality of RRD-compensating RNN corresponding to the identified current number of PE cycles, current retention time and current number of read disturbs for the flash memory;
    loading the selected configuration file of the RRD-compensating RNN into a neural network engine to form an RNN core in the neural network engine;
    performing a neural network operation of the RNN core to predict RRD-compensated TVSO values, wherein the input to the neural network operation includes the identified TVSO values corresponding to the current number of PE cycles of the flash memory,
    wherein, for a respective RRD-compensating RNN, a respective output neuron of the respective RRD-compensating RNN corresponds to a single respective input neuron of the respective RRD-compensating RNN and generates a corresponding respective predicted RRD-compensated TVSO value; and
    performing a read of the flash memory using the predicted RRD-compensated TVSO values.

2. The method of claim 1 wherein, for a respective RRD-compensating RNN, a number of input neurons is equal to a number of TVSO values required for reading the flash memory and a number of output neurons is equal to the number of TVSO values required for reading the flash memory.

3. The method of claim 2 wherein the predicted RRD-compensated TVSO values are stored in the flash controller or in a memory device coupled to the flash controller.

4. The method of claim 2 wherein the identifying the current number of PE cycles, the identifying at the flash controller TVSO values, identifying the current retention time and the current number of read disturbs for the flash memory, the selecting the configuration file, the loading the selected configuration file, the performing the neural network operation and the storing the predicted RRD-compensated TVSO values are repeated each time the number of PE cycles reaches a PE cycle threshold, the current retention time reaches a retention-time threshold or the current number of read disturbs reaches a read-disturb threshold.

5. The method of claim 2 wherein the predicted RRD-compensated TVSO values are stored in a TVSO-read lookup table.

6. The method of claim 1 wherein each stored configuration file includes weighting and bias values for a respective RRD-compensating neural network.

7. The method of claim 5 comprising:
    repeating the identifying TVSO values, identifying a current number of PE cycles, a current retention time and a current number of read disturbs, the selecting, the loading, the performing a neural network operation and the storing the predicted RRD-compensated TVSO values in a TVSO-read lookup table each time the current number of PE cycles reaches a PE cycle threshold, the current retention time reaches a predetermined retention-time threshold or the current number of read disturbs reaches a read-disturb threshold.

8. The method of claim 1 wherein the identifying TVSO values comprises identifying TVSO values corresponding to a non-transitory-reliability-state that corresponds to the current number of PE cycles for a page of the flash memory that is to be read, such that the performing the read uses the RRD-compensated TVSO values for the page of the flash memory to be read.

9. The method of claim 1 wherein the identifying TVSO values comprises identifying TVSO values specified by the manufacturer of the flash memory for the current number of PE cycles of the flash memory.

10. The method of claim 1 wherein the selecting the configuration file of the plurality of RRD-compensating RNN corresponding to the identified current number of PE cycles, current retention time and current number of read disturbs for the flash memory further comprises selecting the configuration file of the plurality of RRD-compensating RNN corresponding to a particular wordline and a particular block of the flash memory.

11. A flash controller comprising:
    a data storage;
    a neural network engine coupled to the data storage;
    a status module to identify a current number of program and erase (PE) cycles, a current retention time and a current number of read disturbs for a flash memory;
    a control module coupled to the neural network engine, the data storage and the status module, the control module to identify threshold voltage shift offset (TVSO) values corresponding to a non-transitory-reliability-state that corresponds to the identified current number of PE cycles for the flash memory, the control module to select a configuration file of a retention-and-read-disturb (RRD)-compensating regression neural network (RNN) corresponding to the current number of PE cycles, the identified current retention time and current number of read disturbs, and to load the selected configuration file of the RRD-compensating RNN into the neural network engine to form an RNN core in the neural network engine,
    the neural network engine to perform a neural network operation of the RNN core to predict RRD-compensated TVSO values, the input to the neural network operation including the identified TVSO values,
    wherein a respective output neuron of the selected RRD-compensating RNN corresponds to a single respective input neuron of the respective RRD-compensating RNN and generates a corresponding respective predicted RRD-compensated TVSO value; and a read module coupled to the status module and to the neural network engine, the read module to perform a read of the flash memory using the predicted RRD-compensated TVSO values.

12. The flash controller of claim 11 wherein the data storage is to store the predicted RRD-compensated TVSO values.

13. The flash controller of claim 11 comprising an external memory device coupled to the flash controller, the predicted RRD-compensated TVSO values stored in the external memory device.

14. The flash controller of claim 11 wherein the control module is to select a configuration file of a RRD-compensating RNN corresponding to a particular wordline and a particular block of the flash memory.

15. The flash controller of claim 11 comprising a TVSO-read lookup table stored in the data storage or in an external memory device, and
wherein the predicted RRD-compensated TVSO values are stored in the TVSO-read lookup table.

16. The flash controller of claim 15 wherein the control module is to determine when the current number of PE cycles reaches a predetermined PE cycle threshold, when the current retention time reaches a predetermined retention-time threshold and determine when the current number of read disturbs reaches a read-disturb threshold, and each time the current number of PE cycles reaches a predetermined PE cycle threshold, the current retention time reaches a predetermined retention-time threshold or the current number of read disturbs reaches a read-disturb threshold:

the status module to repeat the identifying the current number of PE cycles, the current retention time and the current number of read disturbs, the control module to repeat the identifying TVSO values, the control module to repeat the selecting the respective configuration file, the control module to repeat the loading the respective selected configuration file, the neural network engine to repeat the performing the neural network operation of the RNN core to predict the respective RRD-compensated TVSO values, and the control module to repeat the storing the respective predicted RRD-compensated TVSO values by replacing some of the TVSO values previously stored in the TVSO-read lookup table with the predicted RRD-compensated TVSO values.

17. The flash controller of claim 11 wherein the RNN core includes a number of input neurons equal to the number of TVSO values required for reading the flash memory.

18. The flash controller of claim 17 wherein the RNN core includes a number of output neurons equal to the number of TVSO values required for reading the flash memory.

* * * * *